United States Patent
Goki et al.

(10) Patent No.: US 9,917,138 B1
(45) Date of Patent: Mar. 13, 2018

(54) SEMICONDUCTOR DEVICE AND SEMICONDUCTOR MEMORY DEVICE

(71) Applicant: TOSHIBA MEMORY CORPORATION, Minato-ku (JP)

(72) Inventors: Yusuke Goki, Yokkaichi (JP); Keiichi Takenaka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/422,668

(22) Filed: Feb. 2, 2017

Related U.S. Application Data

(60) Provisional application No. 62/394,523, filed on Sep. 14, 2016.

(51) Int. Cl.
  *H01L 29/06* (2006.01)
  *H01L 47/00* (2006.01)
  *H01L 27/24* (2006.01)

(52) U.S. Cl.
  CPC ...... *H01L 27/2481* (2013.01); *H01L 27/2454* (2013.01)

(58) Field of Classification Search
  USPC ............... 257/5, 68–71, 295–309, 905–908, 257/E27.084–E27.097, E27.075, 257/E21.646–E21.66, 151–153, 249, 257/314–320, 331, 366, 387, 412, 257/E29.319, E21.176–E21.86, E21.374, 257/E21.458, E21.621–E21.624, 257/E21.635–E21.638, E21.17, 257/E21.645–E21.694, 288, 401, 901; 438/292–308, 157, 176, 195, 267, 283, 438/585–596
  See application file for complete search history.

(56) References Cited

U.S. PATENT DOCUMENTS

| | | | |
|---|---|---|---|
| 7,746,680 B2 | 6/2010 | Scheuerlein et al. | |
| 8,405,089 B2 | 3/2013 | Uchiyama | |
| 8,946,670 B1 * | 2/2015 | Park | H01L 27/2436 257/2 |
| 2013/0153851 A1 * | 6/2013 | Park | H01L 43/08 257/4 |
| 2015/0349252 A1 * | 12/2015 | Tajima | H01L 45/04 257/4 |

FOREIGN PATENT DOCUMENTS

| | | |
|---|---|---|
| JP | 10-209300 | 8/1998 |
| JP | 2010-219326 | 9/2010 |
| JP | 2011-508973 | 3/2011 |

* cited by examiner

*Primary Examiner* — Tram H Nguyen
(74) *Attorney, Agent, or Firm* — Oblon, McClelland, Maier & Neustadt, L.L.P.

(57) ABSTRACT

A semiconductor device according to the embodiment includes a plurality of semiconductor layers arranged along a first direction and a second direction, wherein each of the semiconductor layers includes a first semiconductor layer and second semiconductor layers positioned at both upper and lower sides of the first semiconductor layer, and a gate electrode which faces the first semiconductor layer. A row of the semiconductor layer in the first direction is oblique to a row of the semiconductor layer in the second direction. At least one part of peripheral faces of the first semiconductor layer is in contact with the gate electrode along the first direction.

19 Claims, 6 Drawing Sheets

SEMICONDUCTOR DEVICE AND SEMICONDUCTOR MEMORY DEVICE

CROSS-REFERENCE TO RELATED APPLICATIONS

This application is based upon and claims the benefit of priority from U.S. Provisional Application No. 62/394,523, filed on Sep. 14, 2016; the entire contents of which are incorporated herein by reference.

FIELD

Embodiments of the present invention relate to a semiconductor device and a semiconductor memory device.

BACKGROUND

In semiconductor memory device, current supply to a memory cell is switched by a vertical thin film transistor, for example. This vertical thin film transistor is required reduction of the ON-resistance.

It is possible to expand a width of the channel formed in a contact area in a gate electrode and a semiconductor layer, as an example of a method for reducing the ON-resistance mentioned above. As a method for expanding the width of the channel, it is possible to expand a width of the semiconductor layer, for example. However, in this case, a space for forming a gate electrode is small, thereby the forming performance of the gate electrode may worsen.

DETAILED DESCRIPTION

Embodiments will now be explained with reference to the accompanying drawings. The present invention is not limited to the embodiments.

A semiconductor device according to the embodiment includes a plurality of semiconductor layers arranged along a first direction and a second direction, wherein each of the semiconductor layers includes a first semiconductor layer and second semiconductor layers positioned at both upper and lower sides of the first semiconductor layer, and a gate electrode which faces the first semiconductor layer. A row of the semiconductor layer in the first direction is oblique to a row of the semiconductor layer in the second direction. At least one part of peripheral faces of the first semiconductor layer is in contact with the gate electrode along the first direction.

Figure 1:
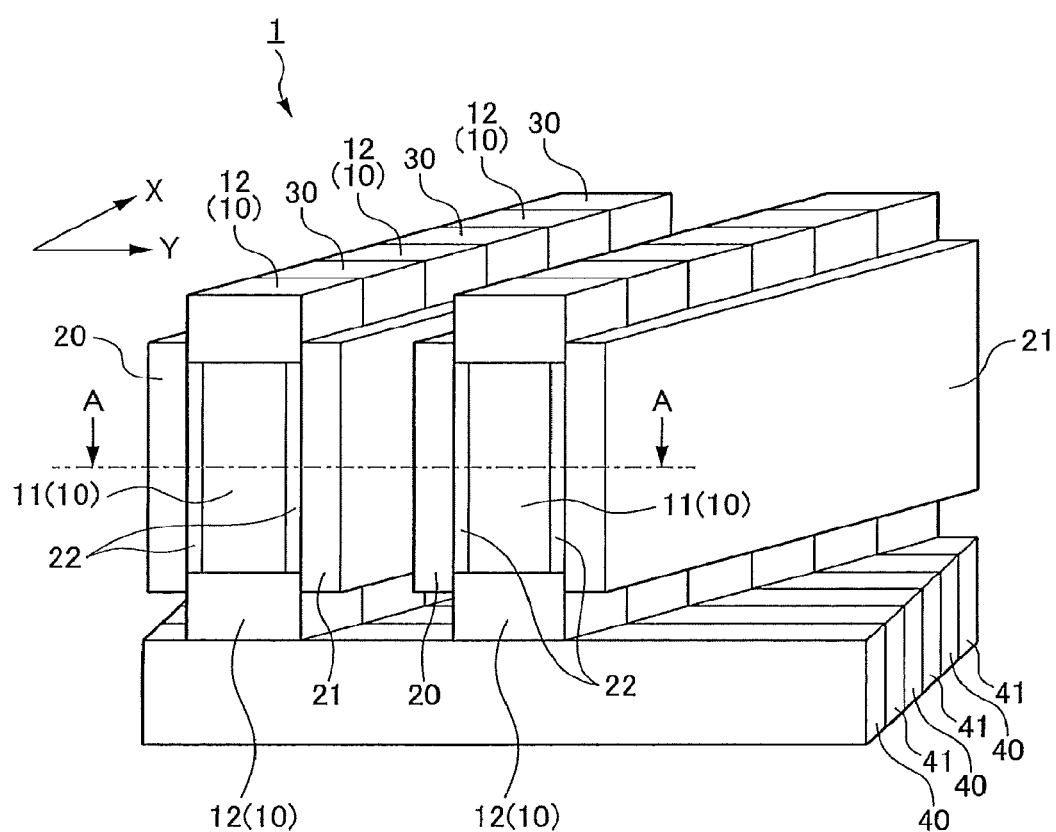
FIG. 1 is a perspective view showing a schematic structure of the semiconductor device according to the embodiment.

FIG. 1 is a perspective view showing a schematic structure of the semiconductor device according to the embodiment. As shown in FIG. 1, the semiconductor device 1 according to the embodiment includes a plurality of semiconductor layers 10 and a pair of gate electrodes 20 and 21.

Each the semiconductor layer 10 is formed by using, for example, polysilicon and includes a first semiconductor layer 11 and a second semiconductor layer 12. The first semiconductor layer 11 is a P-type semiconductor layer, and the second semiconductor layers 12 are N-type semiconductor layers. The second semiconductor layers 12 are positioned in both the upper and lower sides of the first semiconductor layer 11.

A pair of gate electrodes 20 and 21 is formed by using, for example, silicon, and faces each other across the first semiconductor layer 11. When a voltage is supplied to a pair of gate electrodes 20 and 21, channel 22 is generated in the contact area with a pair of gate electrodes 20 and 21 and the first semiconductor layer 11. Thereby, the semiconductor device 1 is in the conduction state. Incidentally, the gate electrodes 20 and 21 do not need to be separated and may form a unit surrounding the peripheral face of the first semiconductor layer 11.

In the embodiment, as shown in FIG. 1, a plurality of semiconductor layers 10 are arranged along a length direction X (the first direction) and a length direction Y (the second direction), respectively. A row of the semiconductor layers 10 in the length direction X is oblique to a row of the semiconductor layers 10 in the length direction Y. Moreover, insulating films 30 are provided between adjacent semiconductor layers 10 in the length direction X. These insulating films 30 are formed by using a silicon oxide film ($SiO_2$), for example.

Moreover, in the embodiment, a plurality of global bit lines 40 are provided under the semiconductor layers 10. The global bit lines 40 are formed of a conductive material. As shown in FIG. 1, a plurality of global bit lines 40 are arranged along the length direction X. An insulating film 41 is provided between the global bit lines 40. The insulating film 41, as well as the insulating film 30 mentioned above, is formed by using, for example, a silicon oxide film ($SiO_2$).

Figure 2:
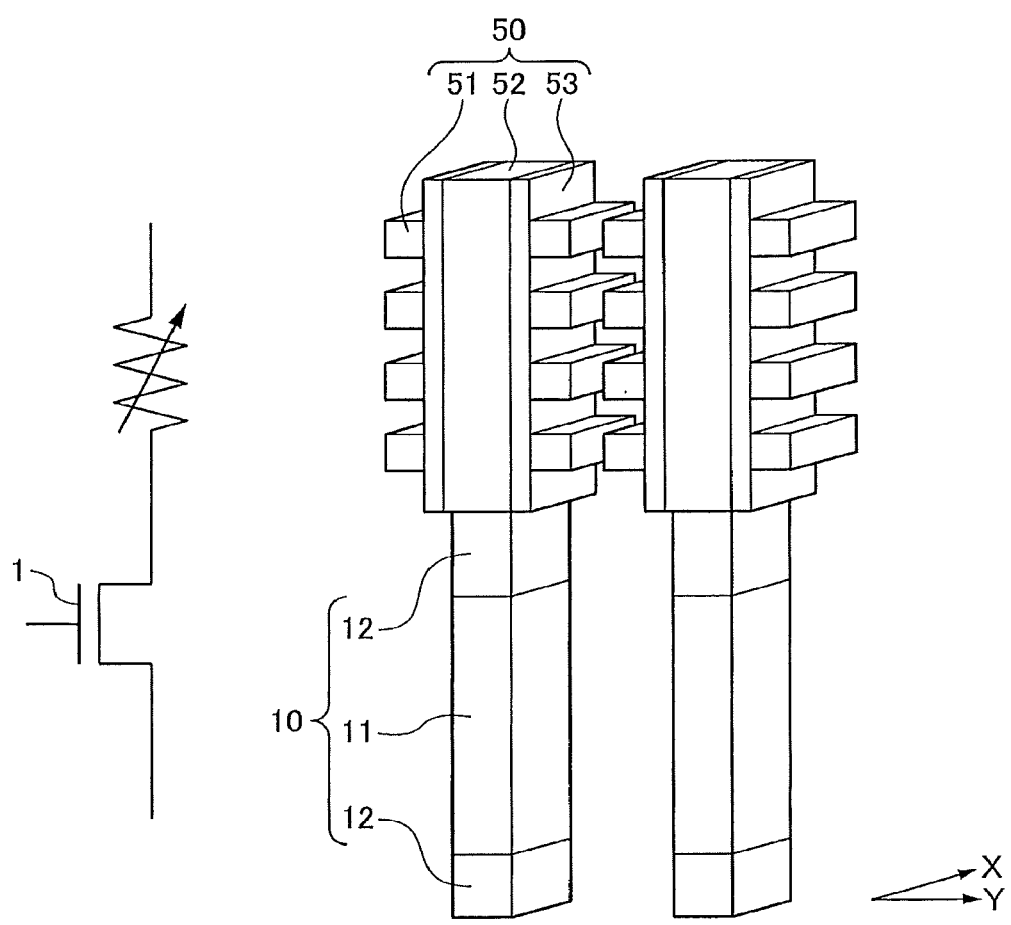
FIG. 2 is a perspective view showing a schematic structure of a memory cell.

Furthermore, in the embodiment, as shown in FIG. 2, a memory cell 50 is positioned on the semiconductor layers 10. The memory cell 50 includes the word rows 51, the bit line 52, and the record films 53 (ReWrite films). The word rows 51 and the bit line 52 includes a conductor. The memory cell 50 functions as a ReRAM (Resistive Random Access Memory), for example.

In the embodiment, the semiconductor device 1 is used for the vertical thin film transistor (vTFT) which switches current supply to the memory cell 50. However, the semiconductor device 1 may be used for a switching element other than such vertical thin film transistor.

Figure 3:
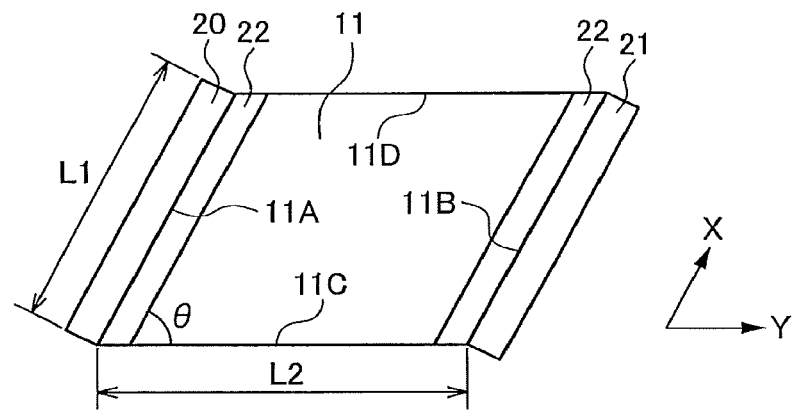
FIG. 3 is a cross-section view showing the horizontal cross-section shape of a first semiconductor layer according to the embodiment.
Figure 4:
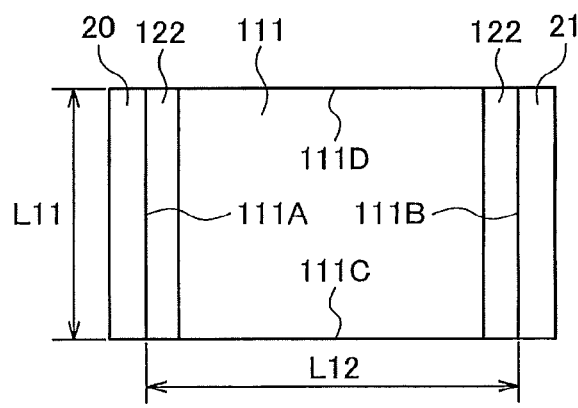
FIG. 4 is a cross-section view showing the horizontal cross-section shape of a first semiconductor layer according to a comparative example.

FIG. 3 is a cross-section view showing a horizontal cross-section shape of the first semiconductor layer according to the embodiment. FIG. 4 is a cross-section view showing a horizontal cross-section shape of the first semiconductor layer according to a comparative example.

As shown in FIG. 3, the horizontal cross-section shape of the first semiconductor layer 11 is a parallelogram which has a side 11A (a first side), a side 11B (a second side), a side 11C (a third side), and a side 11D (a fourth side). The side 11A is in contact with the gate electrode 20 (one of the gate electrodes). The side 11B is in contact with the gate electrode 21 (the other of the gate electrodes) and is parallel to the side 11A. The sides 11C and 11D are in contact with both of the sides 11A and 11B, and are parallel to each other.

On the other hand, as shown in FIG. 4, the horizontal cross-section shape of the first semiconductor layer 111 according to a comparative example is a rectangle which has a side 111A, a side 111B, a side 111C, and a side 111D. The side 111A is in contact with the gate electrode 20, and the side 111B is in contact with the gate electrode 21.

In the embodiment, as shown in FIG. 3, the sides 11A and 11B are oblique to the sides 11C and 11D. On the other hand, in the comparative example, as shown in FIG. 4, the sides 111A and 111B are perpendicular to the sides 111C and 111D. Therefore, the length L1 of the side 11A (or the side 11B) is longer than the length L11 of the side 111A (or the side 111B). Thereby, the area of the channel 22 of the embodiment is larger than the area of the channel 122 of the comparative example. As a result, the electrical resistance of the channel 22 is lower and the ON-resistance of the semiconductor device 1 is lower. At this time, an angle θ (see FIG. 3) between the side 11A and the side 11C is set so that a space for forming the gate electrodes 20 and 21 can be ensured between adjacent first semiconductor layers 11 in the length direction Y. Thereby, the difficulty in forming the gate electrodes 20 and 21 is avoidable.

In this embodiment, both the side 11A and side 11B are oblique to the sides 11C and 11D. However, at least one of the sides 11A and 11B may be oblique to the sides 11C and 11D.

Figure 5:
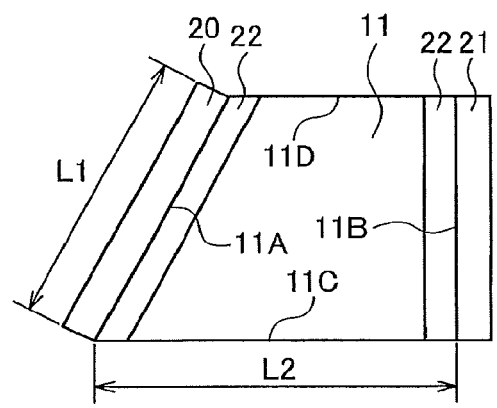
FIG. 5 is a cross-section view showing the horizontal cross-section shape of the first semiconductor layer according to another embodiment.

FIG. 5 is a cross-section view showing a horizontal cross-section shape of the first semiconductor layer according to another embodiment. In FIG. 5, the horizontal cross-section shape of the first semiconductor layer 11 is a trapezoid. In this trapezoid, the side 11A is oblique to the side 11C, and the side 11B is perpendicular to the side 11C. In this case, the length L1 of the side 11A is longer than the length L11 of the side 111A. Thereby, the area of the channel 22 formed on the side of the gate electrode 20 is larger than the area of the channel 122 of the comparative example. Therefore, the electrical resistance of the channel 22 is lower and the ON-resistance of the semiconductor device 1 is lower.

Figure 6:
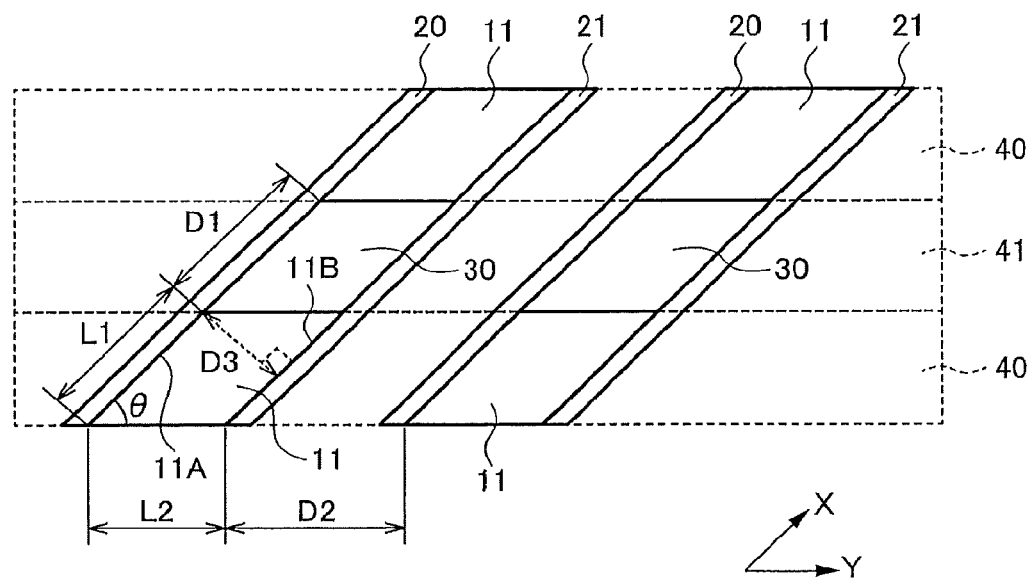
FIG. 6 is a part of cross-section view along to section line A-A shown in FIG. 1.

FIG. 6 is a part of a cross-section view along the section line A-A shown in FIG. 1. In the embodiment, as shown in FIG. 6, a plurality of first semiconductor layers 11 are arranged along the length direction X of the side 11A and along the length direction Y of the side 11C.

When the length L1 of the side 11A is larger, the area of the channel 22 is wider. However, a distance D1 between adjacent sides 11A, in other words, an interval between adjacent first semiconductor layers 11 in the length direction X shortens. When this interval shortens, the forming performance of the semiconductor layer 11 may worsen. Moreover, for miniaturization purposes, when a distance D2 between adjacent sides 11C, in other words, an interval between adjacent first semiconductor layers 11 in the length direction Y is shorter than necessary, the forming performance of the gate electrodes 20 and 21 may worsen.

Consequently, in the embodiment, the distance D1 between adjacent sides 11A is longer than the length L1 of the side 11A, and the distance D2 between adjacent sides 11C is longer than the length L2 of the side 11C. Thereby, the spaces for forming the semiconductor layers 10 and the gate electrodes 20 and 21 can be ensured.

When the angle θ between side 11A and side 11C is smaller than 90 degrees, the area of channel 22 is larger.

However, forming the first semiconductor layer 11 becomes difficult. When the stability of forming is taken into consideration, a liner distance D3 between the side 11A and the side 11B is preferably equal to or more than a half of the length L2 of the side 11C. The liner distance D3 is equal to L2×sinθ. Therefore, the angle θ is preferably equal to or greater than 30 degrees and lesser than 90 degrees.

Figure 7:
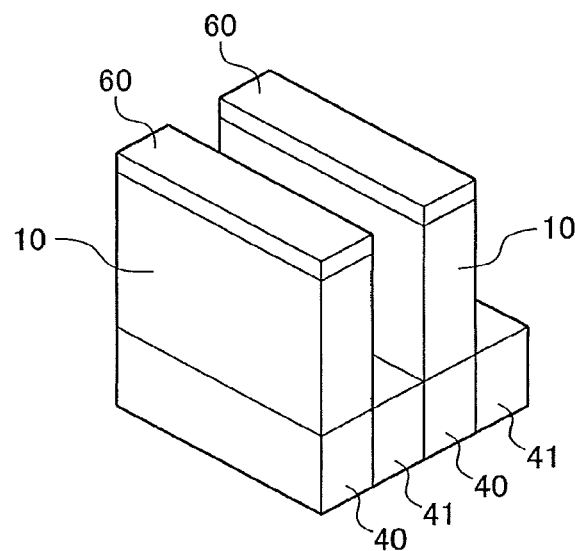
FIG. 7 to FIG. 9 are perspective views simplistically showing a manufacturing process of the semiconductor device according to the embodiment.

Hereinafter, the manufacturing process of the semiconductor device according to the embodiment is simply explained with reference to FIG. 7-FIG. 9. At first, as shown in FIG. 7, the semiconductor layer 10 is formed on the global bit line 40. In this process, pattern processing of the semiconductor layer 10 is carried out by using a mask 60.

Figure 8:
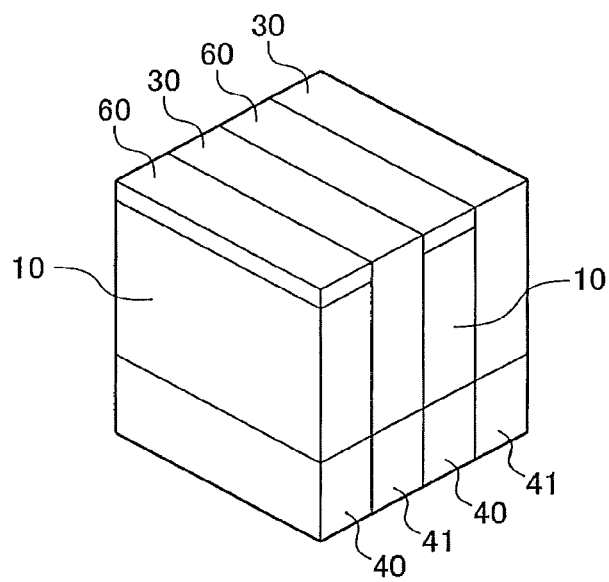
Figure 9:
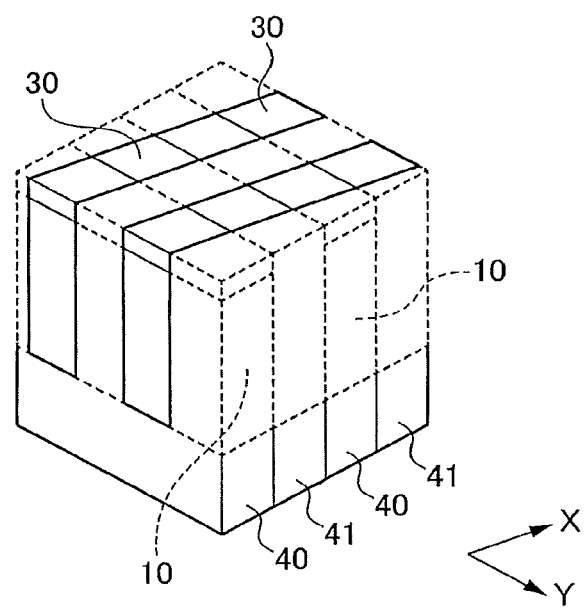

Then, as shown in FIG. 8, the insulating film 30 is embedded on the insulating film 41 i.e., between the semiconductor layers 10. Then, as shown in FIG. 9, the semiconductor layers 10 and the insulating film 30 are patterned. The pattern processing is carried out by photolithography, etching, etc., for example. As a result of pattern processing, the section level of the first semiconductor layer 11 is shaped as a parallelogram. Then, returning to FIG. 1, the gate electrodes 20 and 21 are formed on the first semiconductor layer 11.

According to the embodiment described above, the horizontal cross-section shape of the first semiconductor layer 11 is a parallelogram. That is, in four peripheral faces of the first semiconductor layers 11, a portion which is contact with the gate electrodes 20 and 21 are oblique to another portion which is not in contact with the gate electrodes 20 and 21. Therefore, the space between the first semiconductor layers 11 can be secured while expanding the area of the channel 22. Therefore, the electrical characteristics of the semiconductor device 1 can be improved without impairing the forming performance of the gate electrodes 20 and 21.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a plurality of semiconductor layers arranged along a first direction and a second direction, wherein each of the semiconductor layers comprises a first semiconductor layer and second semiconductor layers positioned at both upper and lower sides of the first semiconductor layer; and
   a gate electrode which faces the first semiconductor layer, wherein
   a row of the semiconductor layers in the first direction is oblique to a row of the semiconductor layers in the second direction, and at least one part of peripheral faces of the first semiconductor layer is in contact with the gate electrode along the first direction.

2. The semiconductor device according to claim 1, wherein
   a horizontal cross-section shape of the first semiconductor layer is a quadrilateral shape, which first and second sides are in contact with the gate electrodes and face each other, and which third and fourth sides are in contact with the first and second sides and face each other.

3. The semiconductor device according to claim 2, wherein
the horizontal cross-section shape of the first semiconductor layer is a parallelogram.

4. The semiconductor device according to claim 3, wherein
a distance between adjacent first sides is equal to or greater than a length of the first side of the parallelogram, and a distance between adjacent third sides is equal to or greater than a length of the third side of the parallelogram.

5. The semiconductor device according to claim 3, wherein
an angle between the first side and the third side is equal to or greater than 30 degrees and lesser than 90 degrees.

6. The semiconductor device according to claim 1, wherein
an insulating film is between adjacent semiconductor layers arranged along the first direction.

7. The semiconductor device according to claim 1, wherein
the first semiconductor layer is a P-type semiconductor layer, and the second semiconductor layers are N-type semiconductor layers.

8. The semiconductor device according to claim 1, wherein
a memory cell is positioned on each semiconductor layer, and a global bit line is positioned under each semiconductor layer.

9. The semiconductor device according to claim 8, wherein
the memory cell is a ReRAM.

10. The semiconductor device according to claim 2, wherein
the horizontal cross-section shape is a trapezoid, which the first side is oblique to the third side, and which the second side is perpendicular to the third side.

11. A semiconductor memory device comprising:
a plurality of semiconductor layers arranged along a first direction and a second direction, wherein each of the semiconductor layers comprises a first semiconductor layer and second semiconductor layers positioned at both upper and lower sides of the first semiconductor layer;
a gate electrode which faces the first semiconductor layer,
a memory cell on each semiconductor layer; and
a global bit line under each semiconductor layer, wherein
a row of the semiconductor layer in the first direction is oblique to a row of the semiconductor layer in the second direction, and at least one part of peripheral faces of the first semiconductor layer is in contact with the gate electrode along the first direction.

12. The semiconductor memory device according to claim 11, wherein
a horizontal cross-section shape of the first semiconductor layer is a quadrilateral shape, which first and second sides are in contact with the gate electrodes and face each other, and which third and fourth sides are in contact with the first and second sides and face each other.

13. The semiconductor memory device according to claim 12, wherein
the horizontal cross-section shape of the first semiconductor layer is a parallelogram.

14. The semiconductor memory device according to claim 13, wherein
a distance between adjacent first sides is equal to or greater than a length of the first side of the parallelogram, and a distance between adjacent third sides is equal to or greater than a length of the third side of the parallelogram.

15. The semiconductor memory device according to claim 13, wherein,
an angle between the first side and the third side is equal to or greater than 30 degrees and lesser than 90 degrees.

16. The semiconductor memory device according to claim 11, wherein
an insulating film is between adjacent semiconductor layers arranged along the first direction.

17. The semiconductor memory device according to claim 11, wherein
the first semiconductor layer is a P-type semiconductor layer, and the second semiconductor layers are N-type semiconductor layers.

18. The semiconductor memory device according to claim 11, wherein
the memory cell is a ReRAM.

19. The semiconductor memory device according to claim 12, wherein
the horizontal cross-section shape is a trapezoid, which the first side is oblique to the third side, and which the second side is perpendicular to the third side.

* * * * *